United States Patent [19]
Lattimore et al.

[11] Patent Number: 5,892,704
[45] Date of Patent: Apr. 6, 1999

[54] WORDLINE AMPLIFIER

[75] Inventors: George McNeil Lattimore, Austin; Robert Anthony Ross, Jr., Cedar Park; Gus Wai-Yen Yeung, Austin, all of Tex.

[73] Assignee: International Business Machines Corporation, Armonk, N.Y.

[21] Appl. No.: 52,245

[22] Filed: Mar. 31, 1998

[51] Int. Cl.[6] .................................................. G11C 5/06
[52] U.S. Cl. ........................................ 365/63; 365/230.06
[58] Field of Search ............................ 365/63, 51, 230.06

[56] References Cited

U.S. PATENT DOCUMENTS 5,572,469  11/1996  Anami et al. ..................... 365/230.06
5,576,989  11/1996  Kowalski .......................... 365/230.06
5,629,903  5/1997  Agata ............................... 365/230.06
5,631,869  5/1997  Ninomiya et al. ................. 365/230.06

*Primary Examiner*—Son T. Dinh
*Attorney, Agent, or Firm*—Kelly K. Kordzik; Winstead Sechrest & Minick P.C.; Anthony V. S. England

[57] ABSTRACT

A memory array of a plurality of memory cells accessed by either a single-ended wordline or a differential pair of wordlines emanating from a wordline decoder is improved by the inclusion of a sense amplifier circuit on the far end of the memory array from the wordline decoder, which operates to amplify the wordline signals.

11 Claims, 6 Drawing Sheets

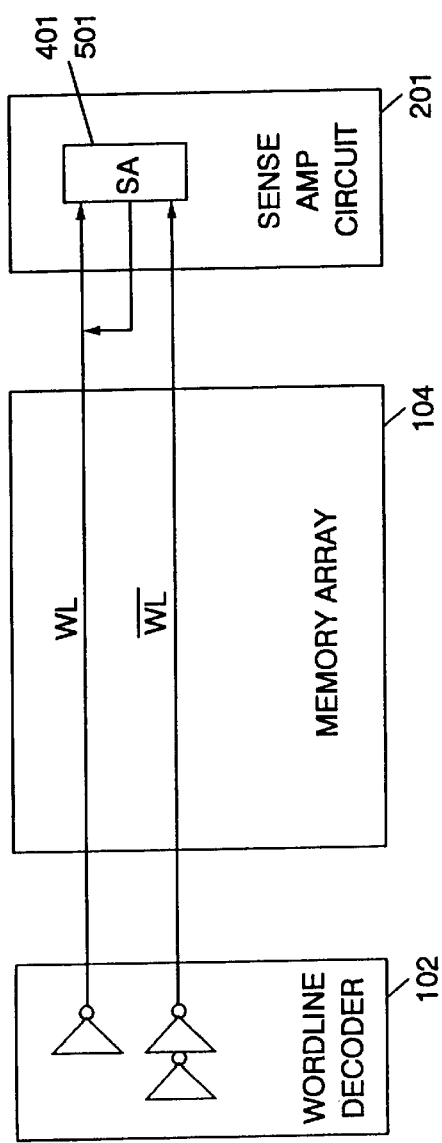
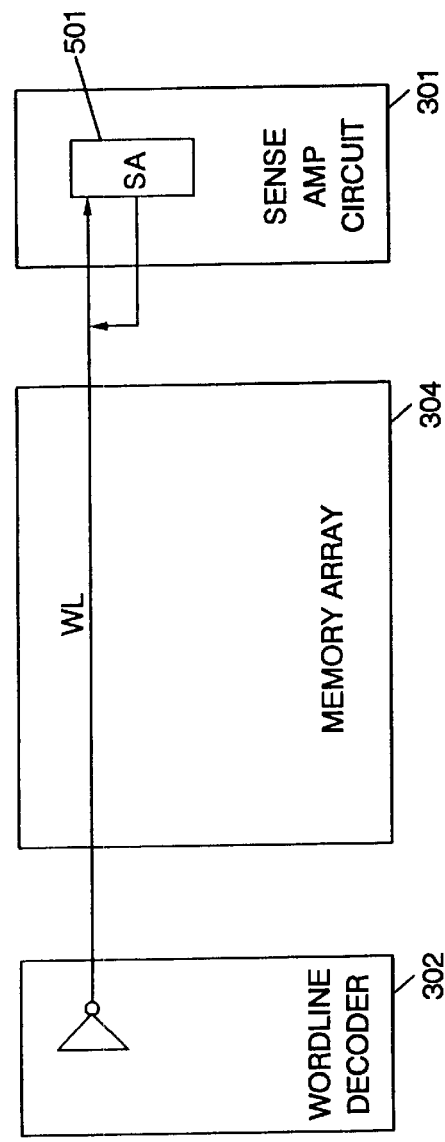

5,892,704

WORDLINE AMPLIFIER

TECHNICAL FIELD

The present invention relates in general to memory cells for use in storage systems and information handling systems, and more particularly, to the activation of wordlines within such memory cells.

BACKGROUND INFORMATION

With today's software being developed, computer systems are in need of larger memory systems in order to adequately and efficiently run such software programs. As a result, memory systems often occupy a large amount of the integrated circuit ("chip") area. Often such memory cell arrays operate as cache memories associated with the microprocessor. As these memory arrays grow larger (even if the area occupied by the memory array does not increase, the number of transistors needed to implement the array may still increase) it is necessary to ensure that the performance of the array improves, or at least does not degrade.

With such memory arrays, memory latency is a critical performance limiter. Means to speed up memory access for memory array designs are needed for memory chips and embedded memories. This is more critical as larger DRAMs are embedded on microprocessor chips as large caches or system memory. Therefore, there is a need in the art for increasing the speed of the transition time for memory accesses in memory arrays.

SUMMARY OF THE INVENTION

The present invention addresses the foregoing need by increasing the speed of the transition time of a memory wordline by adding a slave amplifier to the far end of each of the wordlines. The slave amplifier senses that the wordline is beginning to transition and assists the transition by amplifying the signal generated on the wordline. Such a slave amplifier may be implemented as a voltage sense amplifier in either a single-ended wordline design or wordlines implemented as differential pairs.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates the present invention implemented for amplifying a differential pair wordline;

FIG. 3 illustrates the present invention implemented to amplify a single-ended wordline;

DETAILED DESCRIPTION

Figure 1:
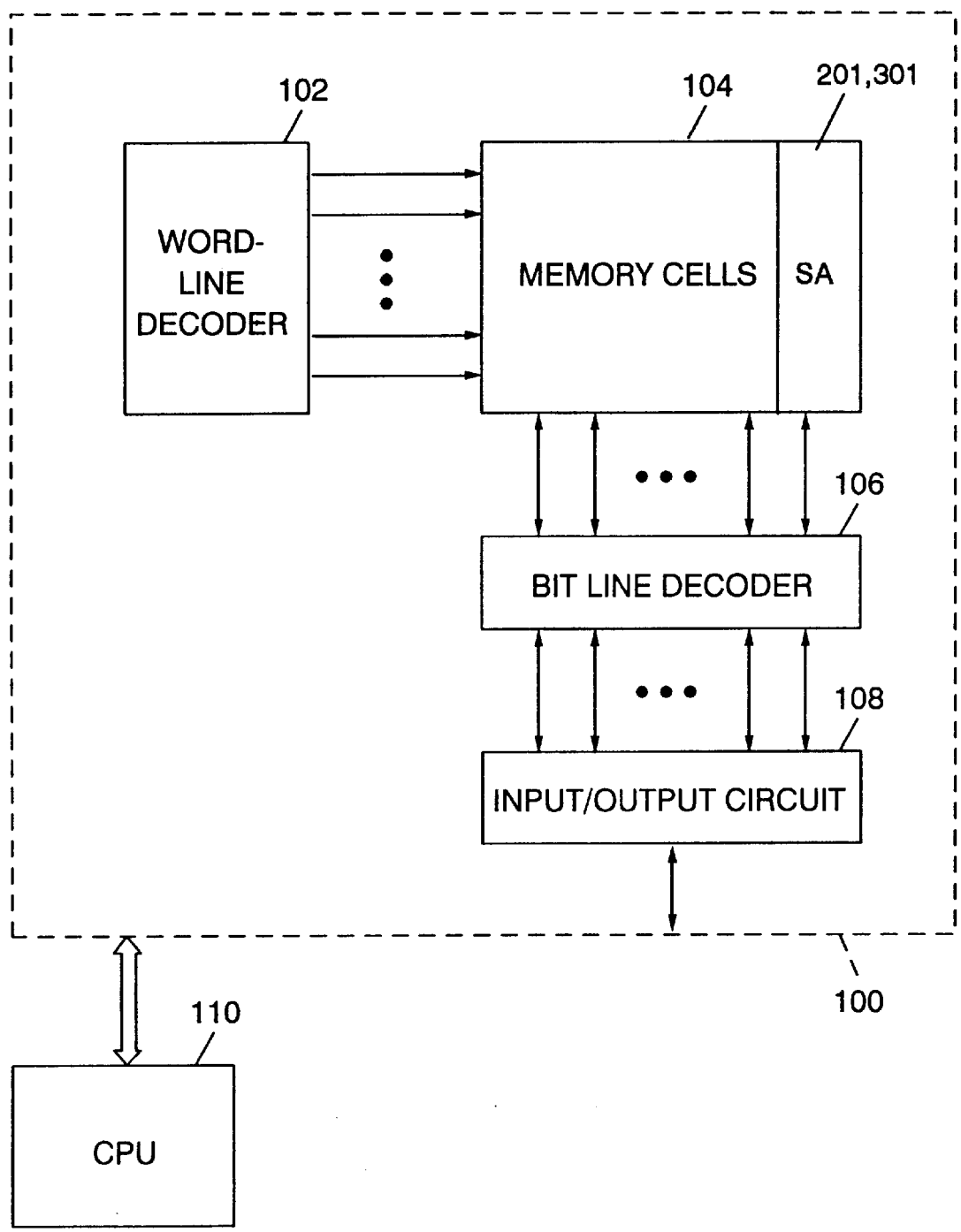
FIG. 1 illustrates a memory array configured in accordance with the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 7:
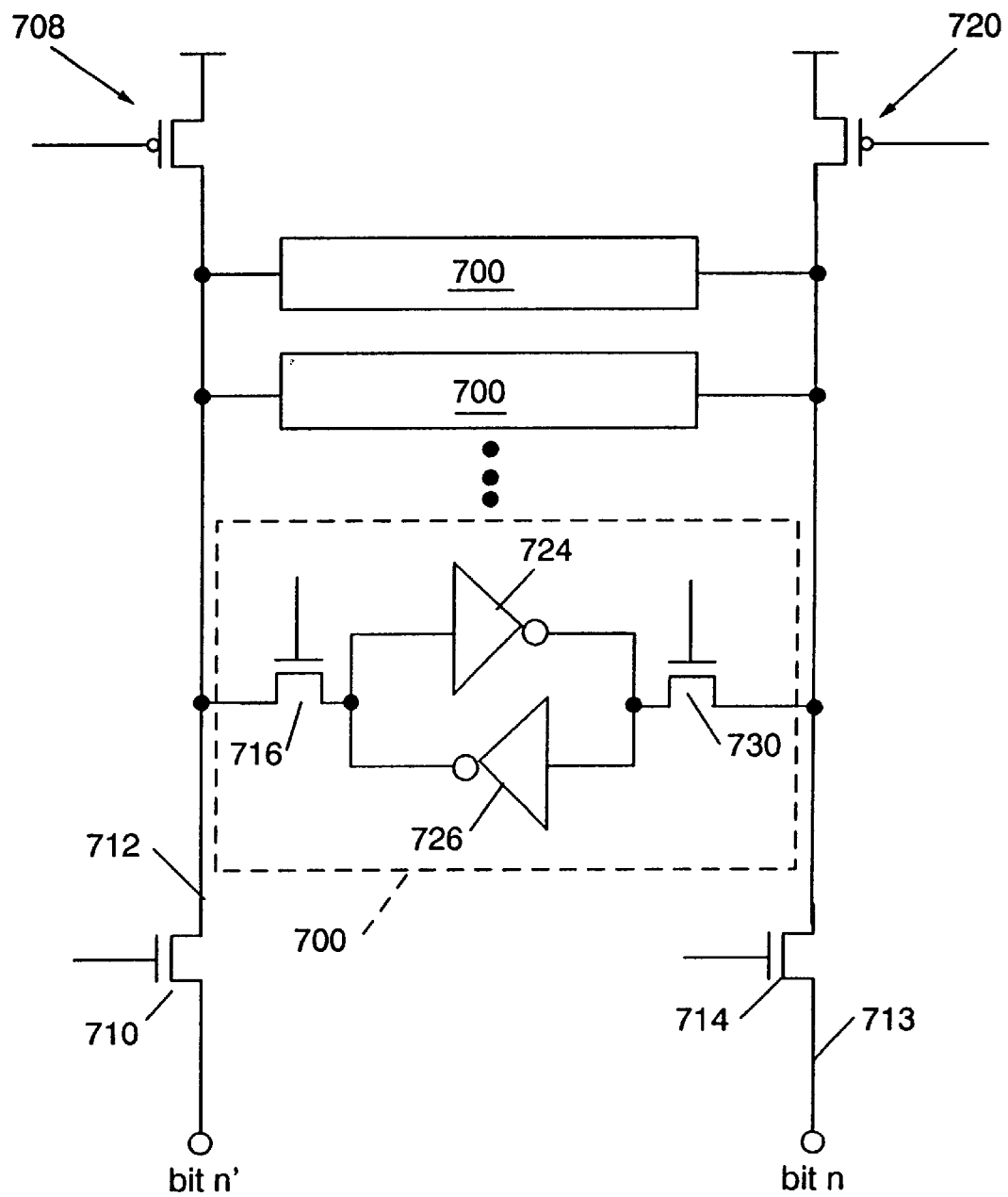
FIG. 7 illustrates a typical memory cell.

FIG. 7 illustrates a typical memory cell 700 having a standard design. Each cell 700 has a bitline 713 and its complement 712. Cell 700 operates differentially between bitline 713 and complement 712. Precharge transistor 720 precharges bitline 713, and precharge transistor 708 precharges complement 712. Control transistor 716 gates data from complement line 712 to the latch formed of cross-coupled inverter 724 and 726. Transistor 730 controls the connection between the latch formed of inverter 724 and 726 and bitline 713. The gate electrodes of transistors 716 and 730 are coupled to differential wordlines (not shown). Transistor 714 is a write enable control transistor. Transistor 710 is a write enable control for complement bitline 712.

Figure 6:
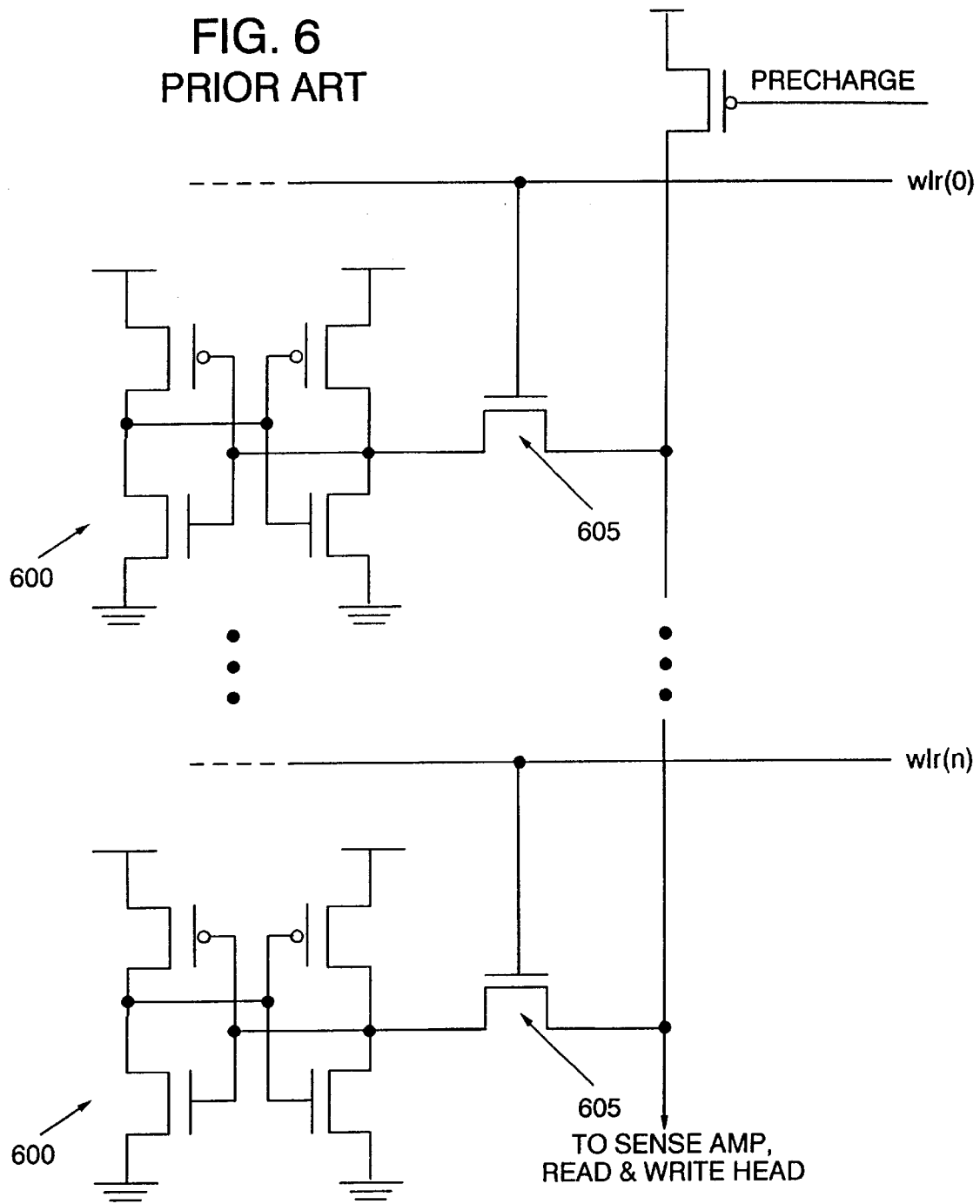
FIG. 6 illustrates a typical single-ended wordline memory array.

Referring to FIG. 6, there is illustrated a plurality of memory cells 600 wherein there is only one passgate 605 coupled to its respective single-ended wordline for each cell 600.

Referring to FIG. 1, there is illustrated memory cells 104, which may be implemented with either memory cells 600 or memory cells 700 in accordance with the present invention. Memory cells 104 are accessed using wordline decoder 102 and bitline decoder 106 along with input/output circuit 108. Memory sub-system embodying the foregoing may be a cache memory, primary or secondary, coupled to a central processing unit ("CPU") 110. However, memory sub-system 100 may be any memory system within a data processing system (see FIG. 8). The sense amplifier ("amp") circuit of the present invention is shown in FIG. 1, but will be described in further detail with respect to FIGS. 2–5. Note that current sense amps may also be used in macro 201.

Referring to FIG. 2, there is illustrated one embodiment of the present invention implemented in a configuration whereby each of the memory cells within memory array 104 are accessed by a differential pair of wordlines, WL and $\overline{WL}$, driven by wordline decoder 102. The wordlines pass through the entire memory array 104 and are received by sense amplifier 401, 501 within sense amp macro 201. The sense amplifier 401, 501 senses when the wordline is beginning to transition and assists the transition by amplifying the received signal and driving it back across memory array 104.

FIG. 3 illustrates an alternative embodiment of the present invention wherein only one wordline is sensed by the single-ended sense amplifier 501 within sense amp macro 301.

Memory array 104 may include memory cells 700 or any other type of memory cell driven by a differential pair of wordlines.

Memory array 304 may also be comprised of memory cells driven by a differential pair of wordlines, or memory cells driven by a single-ended wordline, such as illustrated in FIG. 6. Note that the alternative embodiment illustrated in FIG. 3 may be implemented with differential pair wordlines or single-ended wordlines.

Figure 4:
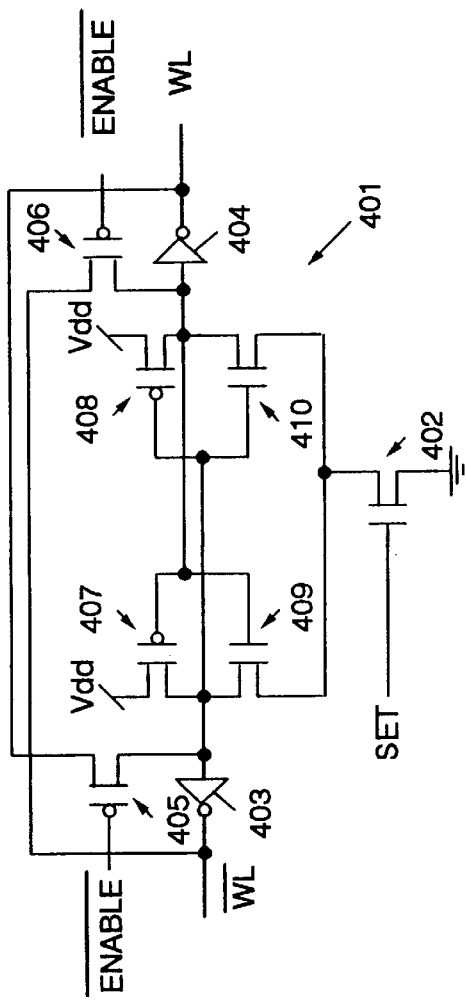
FIG. 4 illustrates one embodiment of the sense amplifier in accordance with the present invention.

Referring next to FIG. 4, there is illustrated sense amp 401. Sense amp 401 receives the differential pair of wordline signals WL and $\overline{\text{WL}}$. ENABLE signals are also received by PFETs 405 and 406. Furthermore, a SET signal is received by NFET 402. In a current sense amp implementation, a SET signal will not be required, however, a current reference will be needed. In the embodiments of the present invention using voltage sense amps, the SET signal is used to allow signal margin to develop. The SET signal can be bussed on a predecode wordline (a wordline with less logic decoding and will arrive at the destination faster). The ENABLE signal can be bussed on a clock.

Wordline signal WL is received by amplifier 401 and passed through PFET 405 and received by PFET 408 and NFET 410. If WL is low, then PFET 408 is activated driving a high signal through tri-state inverter 404, which amplifies the low WL signal. Tri-state buffer/inverter 404 is used so that it will not slow down the WL path when SET is not activated. If WL is high, then NFET 410 will be activated to drive tri-state inverter 404 with a low signal, thus amplifying the high WL signal. The same is true for the received signal $\overline{\text{WL}}$, which is passed through PFET 406 and received by PFET 407 and NFET 409. Depending on the value of signal $\overline{\text{WL}}$, it will be amplified by either the activation of PFET 407 or NFET 409 and the inversion through tri-state inverter 403.

Figure 5:
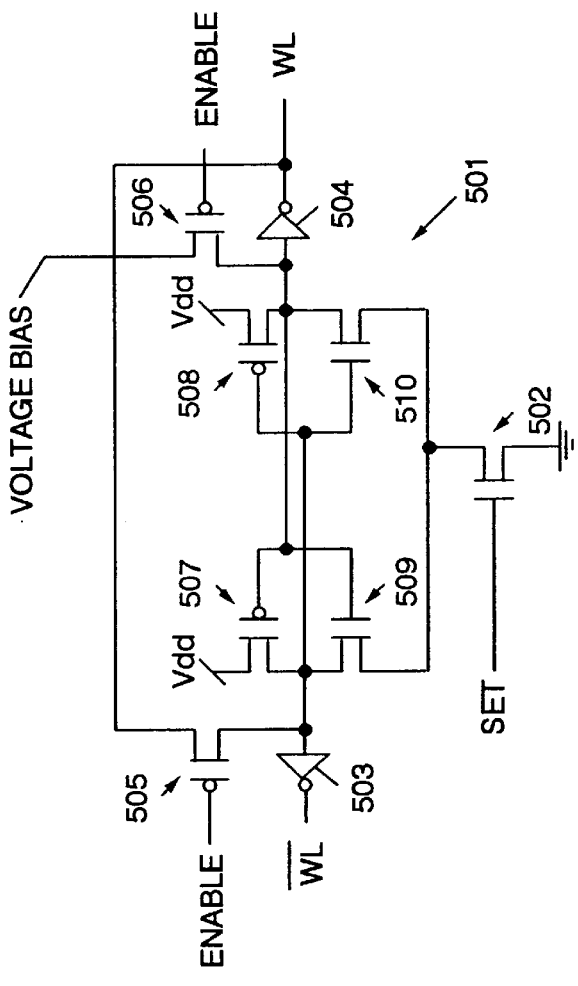
FIG. 5 illustrates an alternative embodiment of the sense amplifier.

FIG. 5 illustrates an alternative embodiment of the sense amplifier as 501. Sense amplifier 501 may be implemented to drive a differential wordline pair or only one wordline. Devices 505 and 506 operate similarly as devices 405 and 406. Tri-state inverters 503 and 504 operate similarly as inverters 403 and 404. PFETs 507 and 508 operate similarly as PFETs 407 and 408. NFETs 502, 509, and 510 operate similarly as NFETs 402, 409, and 410. The main difference between circuits 401 and 501 is that pass device 506 is coupled to a voltage bias signal as opposed to receiving the $\overline{\text{WL}}$ signal.

Figure 8:
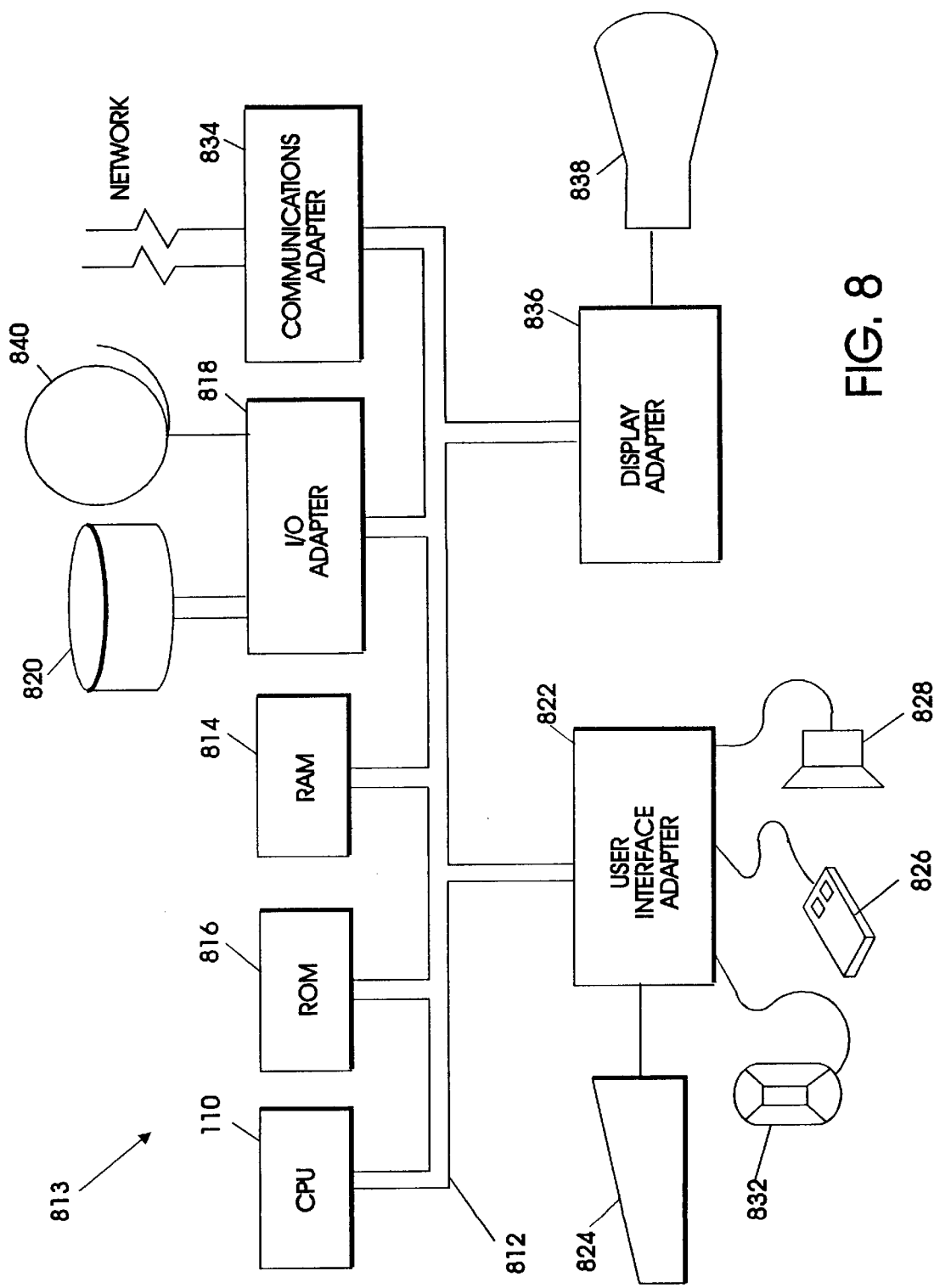
FIG. 8 illustrates a data processing system configured in accordance with the present invention.

CPU 110 in FIG. 1 may be a portion of data processing system 813 illustrated in FIG. 8. A representative hardware environment for practicing the present invention is depicted in FIG. 8, which illustrates a typical hardware configuration of workstation 813 in accordance with the subject invention having central processing unit (CPU) 110, such as a conventional microprocessor, and a number of other units interconnected via system bus 812. Workstation 813 includes random access memory (RAM) 814, read only memory (ROM) 816, and input/output (I/O) adapter 818 for connecting peripheral devices such as disk units 820 and tape drives 840 to bus 812, user interface adapter 822 for connecting keyboard 824, mouse 826, speaker 828, microphone 832, and/or other user interface devices such as a touch screen device (not shown) to bus 812, communication adapter 834 for connecting workstation 813 to a data processing network, and display adapter 836 for connecting bus 812 to display device 838. CPU 110 may include other circuitry not shown herein, which will include circuitry commonly found within a microprocessor, e.g., execution unit, bus interface unit, arithmetic logic unit, etc. CPU 110 may also reside on a single integrated circuit. The present invention may be implemented in any memory system in workstation 813.

Although the present invention and its advantages have been described in detail, it should be understood that various changes, substitutions and alterations can be made herein without departing from the spirit and scope of the invention as defined by the appended claims.

What is claimed is:

1. Memory circuitry comprising:

a memory array including a plurality of memory cells;

a wordline for accessing the plurality of memory cells;

a wordline decoder for driving a signal onto the wordline; and a sense amplifier for amplifying the signal on the wordline.

2. The memory circuitry as recited in claim 1, wherein the sense amplifier is connected to the wordline at a location other than coextensively with the wordline decoder.

3. The memory circuitry as recited in claim 1, wherein the wordline decoder and the sense amplifier are connected to the wordline at separate locations.

4. The memory circuitry as recited in claim 1, wherein the wordline decoder and the sense amplifier are connected to the wordline at opposite ends of the wordline.

5. The memory circuitry as recited in claim 4, wherein the wordline passes through the memory array having a first end on one end of the memory array and a second end on the other end of the memory array, wherein the wordline decoder is connected to the wordline at the first end and the sense amplifier is connect to the wordline at the second end.

6. The memory circuitry as recited in claim 1, wherein the wordline comprises a differential pair of wordlines, wherein the sense amplifier amplifies both of the differential pair wordline signals.

7. The memory circuitry as recited in claim 1, wherein the sense amplifier further comprises:

a first inverter having an input coupled to the wordline; and a second inverter having an input coupled to an output of the first inverter, wherein an output of the second inverter is coupled to the wordline.

8. The memory circuitry as recited in claim 6, wherein the sense amplifier further comprises:

a first inverter having an input coupled to a first one of the differential pair of wordlines; and a second inverter having an input coupled to an output of the first inverter, wherein an output of the second inverter is coupled to the first one of the differential pair of wordlines.

9. The memory circuitry as recited in claim 8, wherein the sense amplifier further comprises:

a third inverter having an input coupled to a second one of the differential pair of wordlines; and a fourth inverter having an input coupled to an output of the third inverter, wherein an output of the fourth inverter is coupled to the second one of the differential pair of wordlines.

10. The memory circuitry as recited in claim 8, wherein the sense amplifier further comprises:

a third inverter having an input coupled to the output of the first inverter; and a fourth inverter having an input coupled to an output of the third inverter, wherein an output of the fourth inverter is coupled to the second one of the differential pair of wordlines.

11. The memory circuit as recited in claim 10, wherein the output of the first inverter is coupled to a voltage potential.

* * * * *